United States Patent [19]
Garcia et al.

[11] Patent Number: 5,270,221
[45] Date of Patent: Dec. 14, 1993

[54] METHOD OF FABRICATING HIGH QUANTUM EFFICIENCY SOLID STATE SENSORS

[75] Inventors: Enrique Garcia, Sandy Hook; Richard Poole, Norwalk; William America, Newtown, all of Conn.

[73] Assignee: Hughes Aircraft Company, Los Angeles, Calif.

[21] Appl. No.: 972,030

[22] Filed: Nov. 5, 1992

[51] Int. Cl.$^5$ .................. H01L 31/18; H01L 21/70
[52] U.S. Cl. ........................................ 437/2; 437/5; 437/53; 437/974; 148/DIG. 135
[58] Field of Search ............ 437/53, 974, 2, 5; 148/DIG. 12, DIG. 135

[56] References Cited

U.S. PATENT DOCUMENTS

| | | | |
|---|---|---|---|
| 4,774,196 | 9/1988 | Blanchard | 148/DIG. 135 |
| 5,013,681 | 5/1991 | Godbey et al. | 437/974 |
| 5,162,251 | 11/1992 | Poole et al. | 437/53 |

FOREIGN PATENT DOCUMENTS 215041  8/1989  Japan .................. 148/DIG. 12

*Primary Examiner*—Brian E. Hearn
*Assistant Examiner*—Linda J. Fleck
*Attorney, Agent, or Firm*—Michael W. Sales; Wanda K. Denson-Low

[57] ABSTRACT

A method for fabricating thinned, back-illuminated, solid state image sensors 10 includes steps of positively doping a bottom surface 22 of a top semiconductor wafer 24, and bonding the bottom surface 22 of the top semiconductor wafer 24 to a top surface 26 of a bottom semiconductor wafer 28 with a silicon dioxide passivation layer 34 in between. The top wafer 24 is thinned and an insulating layer of silicon dioxide 36 and a polysilicon gate structure 38 are formed thereover. Individual dies 40 are then formed, which are bonded to a substrate 42 along each pixel face. The bottom semiconductor wafer layer 28 is etched away to expose the silicon dioxide passivation layer 34, which acts to protect the thinned top wafer layer 24. The dies 40 are then etched to expose bonding pads within the gate structure 38, and sized to create thinned, back-illuminated, solid state image sensors 10.

23 Claims, 4 Drawing Sheets

METHOD OF FABRICATING HIGH QUANTUM EFFICIENCY SOLID STATE SENSORS

BACKGROUND OF THE INVENTION

The present invention generally relates to methods for fabricating solid state image sensors and, more particularly, to a method for fabricating thinned, back-illuminated, solid state image sensors that have an inherently high quantum efficiency over a broad spectral range.

Thinned solid state image sensors, such as charge coupled devices (CCD's), are widely used in the field of image processing. These sensors are generally used to provide electrical signal representations of incident electromagnetic radiation intensities over a particular spectral band. Of course, the most common spectral band used for image processing is the visible band.

Thinned solid state image sensors, particularly CCD's, are typically made of silicon to take advantage of the properties of the silicon crystal lattice. In crystalline form, each atom of silicon is covalently bonded to its neighboring silicon atoms resulting in an energy band gap of approximately 1.12 eV. To break one of the covalent bonds, and thus create an electron-hole pair, an energy greater than the energy band gap is required. Incident electromagnetic radiation in the form of photons having wavelengths shorter than 1 $\mu$m possess such energy.

The wavelength of an incoming photon (light), and the depth to which an incoming photon penetrates into a piece of silicon are directly related; the shorter the wavelength, the shorter the penetration depth. Silicon becomes transparent to light at a wavelength of approximately 1100 nm and is essentially opaque to light at wavelengths shorter than 400 nm. Thus, when designing solid state image sensors, the thickness of a silicon base layer, as well as many other parameters, can be chosen to optimize performance over a specific spectral band.

In order to measure the electronic charge produced by incident photons in, for example, a CCD, a means for collecting this charge is required. Thus, potential wells are formed, wherein a thin insulating layer of silicon dioxide is grown on a silicon base layer, and a conductive gate structure is formed over the silicon dioxide layer. The gate structure is formed in an array of columns and rows, thus making it possible, by applying a positive electrical potential to the various gate elements, to create depletion regions, or potential wells, in the silicon base layer where free electrons generated by the incoming photons can be stored.

By controlling the electrical potential applied to adjacent gates, depletion regions, or potential wells, containing free electrons can be caused to migrate along a column, or row, so that a signal may eventually be output at the edge of the array. Typically, the gate structure is arranged using multiple phases, usually three phases, so that the potential wells may be successively migrated through the silicon to the array edge. It should be noted, however, that since the charge in the potential wells located far from the array edge must undergo hundreds of transfers, the charge transfer efficiency of the CCD is a critical parameter, as is the quantum efficiency and the spectral response. These considerations are of particular importance when extremely low light levels are to be sensed.

In a front-illuminated solid state image sensor, such as the CCD described above, light normally enters the silicon base layer by passing through the gates formed on the silicon dioxide layer. The gates are usually fabricated of very thin polysilicon, which is reasonably transparent to long wavelengths but becomes opaque at wavelengths shorter than 400 nm. Thus, at short wavelengths, the gate structure greatly attenuates incoming light.

To overcome the attenuation problems of front-illuminated solid state image sensors, it has become common practice to uniformly thin the silicon base layer to a thickness on the order of 10 $\mu$m using conventional chemical etching techniques. After thinning, it becomes possible to focus an image on the back silicon surface of a CCD, where there is no gate structure to attenuate the incoming light. Thus, a thinned, back-illuminated, solid state image sensor is formed having an improved quantum efficiency and spectral response. These devices have been found to exhibit high sensitivity to radiation from the soft X-ray to the near infrared regions of the electromagnetic spectrum.

Although the conventional chemical etching techniques used to thin the silicon base layer as described above are sufficient in their prescribed functions, they nevertheless result in several unwanted consequences. First, the chemical etchants used leave the back silicon surface roughened with surface variations on the order of 500 Angstroms and frequent etch pits. Thus, the resulting surface is severely wrinkled, and even if flattened by attaching to a support structure, significant non-planarity remains. Such non-planarity degrades performance, especially when used in fast (small f-number) optical systems. Secondly, the chemical etching techniques used require the active CCD circuitry on each pixel face to be protected during the etching process. Typically, each pixel face is waxed to a support substrate during the etching process and transferred to a second, optically transparent, substrate thereafter. This approach results in excessive handling of the CCD's, and thus significantly increases the possibility of damage thereto.

Although not previously addressed, another problem exists with the above-described method of fabricating thinned, back-illuminated, solid state image sensors. Due to the fact that the thinned silicon surface is left bare after the etching process, it is subject to surface charging, surface state formation, and other contamination problems all of which are detrimental to device performance. The fundamental problem is that no fully effective method has been found to passivate the back silicon surface after the thinning process is completed. Thermal oxidation of the back silicon surface, the established technique for high quality passivation of silicon surfaces, is not possible because the high temperatures involved (greater than 900 degrees Celsius) would destroy the active CCD circuitry. Accordingly, it is desirable to overcome this passivation problem, and the other above-mentioned shortcomings associated with fabricating thinned, back-illuminated solid state image sensors.

SUMMARY OF THE INVENTION

The present invention contemplates a method for fabricating thinned, back-illuminated, solid state image sensors, such as CCD's, wherein the above-mentioned problems and shortcomings of the prior art are overcome. This method is realized by utilizing a starting substrate that has a structure similar to that commonly used for silicon-on-insulator (SOI) devices. Such a substrate consists of two silicon wafers that are thermally bonded together with a layer of silicon dioxide therebetween. The silicon dioxide layer later acts as a passivation layer for the finished devices.

Prior to thermally bonding the two silicon wafers together, the top wafer, upon which active CCD circuitry will later be formed, is prepared by first ion implanting or thermally diffusing a positive dopant onto its bottom surface. This positively doped bottom surface of the top wafer and the top surface of the bottom wafer are then subject to a thermal oxidation process for the purpose of growing a silicon dioxide passivation layer over each surface. The two wafers are then thermally bonded together, forming a single passivation layer between them, and the top wafer is thinned to a desired thickness of approximately 10 μm using standard techniques. Fabrication of the active CCD circuitry then proceeds in a conventional manner with the formation of a silicon dioxide insulating layer and a polysilicon gate structure. It should be noted that the bottom surface of the top wafer is furnished with a p-type dopant so as to provide a built-in electric field that will drive photo-electrons away from the bottom surface and toward the signal collecting potential wells of the active CCD circuitry.

An alternative method of achieving a layered structure that is similar to the one described above is to initially subject the bottom surface of the top wafer and the top surface of the bottom wafer to a thermal oxidation process and then thermally bond the two wafers together, forming a single silicon dioxide passivation layer between them. The top wafer is then thinned to a thickness of approximately 0.5 μm and ion implanted or thermally diffused with a p-type dopant. An epitaxial layer of silicon is then formed over this positively doped wafer, or, more appropriately, layer, to achieve a total silicon thickness of approximately 10 μm. Fabrication of the active CCD circuitry then proceeds in the conventional manner.

After fabrication of the CCD circuitry, devices from either of the above-described layered structures can be used with no further processing as conventional, front-illuminated, CCD's. For back illuminated CCD's, however, the active circuitry side of each device is mounted or bonded to a substrate having a thermal coefficient of expansion that is matched to that of the device. This bonding process is thoroughly characterized and described in a related and copending patent application having a Ser. No. 07/670,841, entitled, Thinned Charge-Coupled Devices and Method for Making the Same, filed on Mar. 18, 1991, and assigned to the assignee hereof, and is hereby incorporated by reference.

Once a device has been bonded to a substrate, the bottom silicon wafer layer is etched away using standard chemical etching techniques. This etching process is simplified by the presence of the passivation layer, since it acts as a stop etch layer. Thus, the presence of the passivation layer makes this etching process a non-critical procedure of simply etching away the bottom silicon wafer layer with no need to precisely control its final thickness or its uniformity. Furthermore, after the bottom silicon wafer layer has been etched away, the presence of the passivation layer protects the bottom surface of the thinned device from surface charging, surface state formation, and other contamination problems all of which are detrimental to device performance, particularly with respect to quantum efficiency and spectral response.

From the above descriptive summary it is thus apparent how the present invention fabrication method overcomes the problems and shortcomings associated with the above-mentioned prior art.

Accordingly, one objective of the present invention is to provide a method for fabricating thinned, back-illuminated, solid state image sensors that have an inherently high quantum efficiency over a broad spectral range.

Other objectives and advantages of the present invention will become apparent to those skilled in the art upon reading the following detailed description and claims, in conjunction with the accompanying drawings which are appended hereto.

BRIEF DESCRIPTION OF THE DRAWING

The drawing, not drawn to scale, includes.

DETAILED DESCRIPTION OF THE INVENTION

Figure 1:
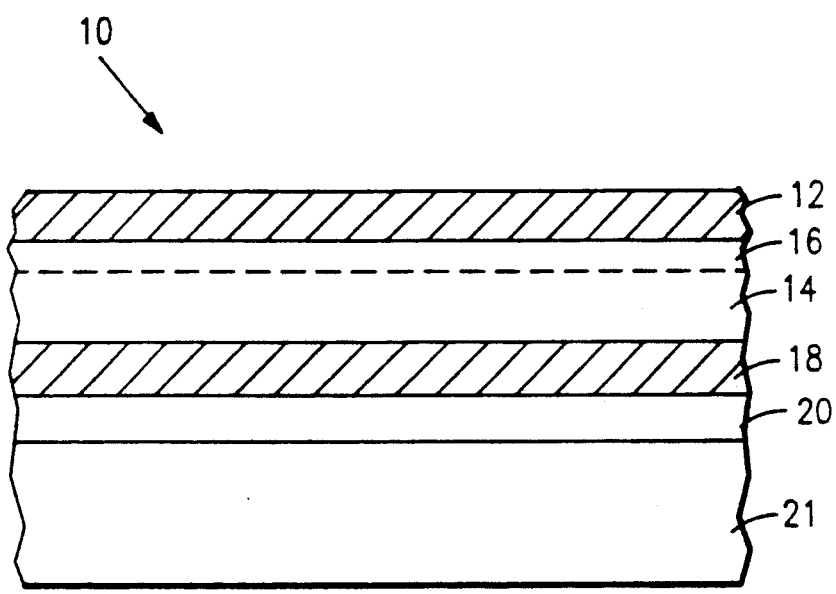
FIG. 1 is a cross-sectional view of a portion of a thinned, back-illuminated, CCD having a desired layer structure that is achievable by following the fabrication method of the present invention.
Figure 2A:
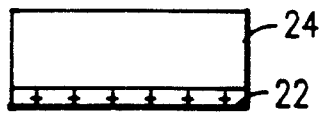
FIGS. 2a to 2f illustrate the initial basic steps of the fabrication method of the present invention.
Figure 2B:
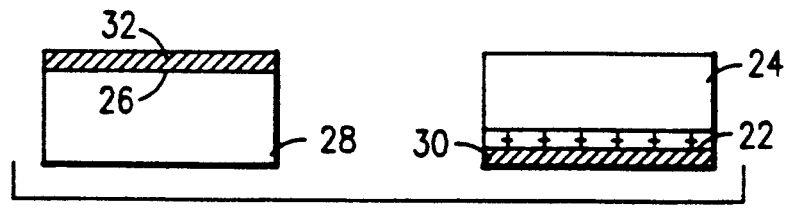
Figure 2C:
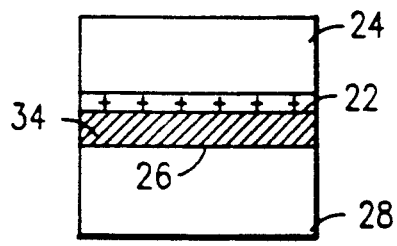
Figure 2D:
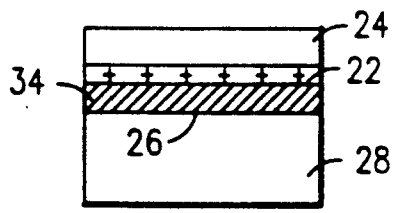
Figure 2E:
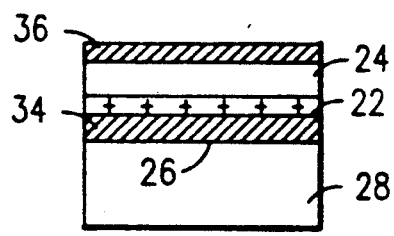
Figure 2F:
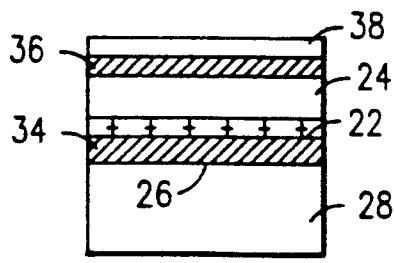
Figure 3A:
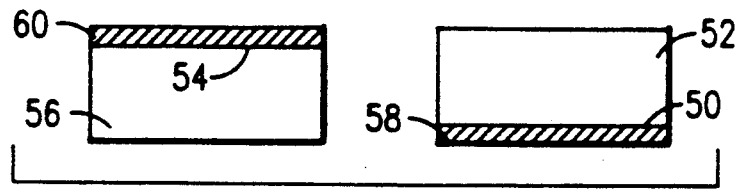
FIGS. 3a to 3g illustrate initial basic steps of the fabrication method of the present invention that are alternate to the steps illustrated in FIG. 2.
Figure 3B:
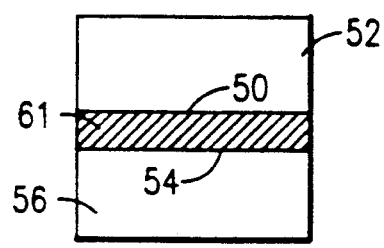
Figure 3C:
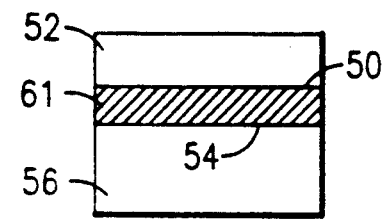
Figure 3D:
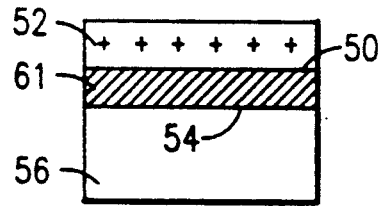
Figure 3E:
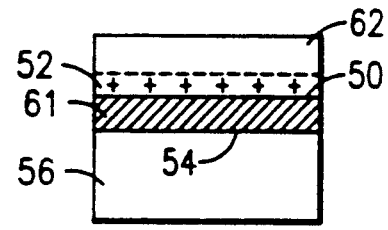
Figure 3F:
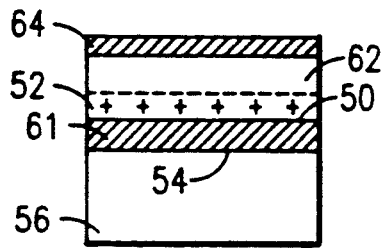
Figure 3G:
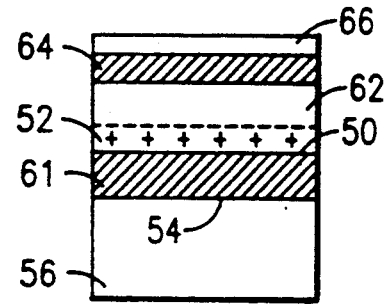
Figure 4A:
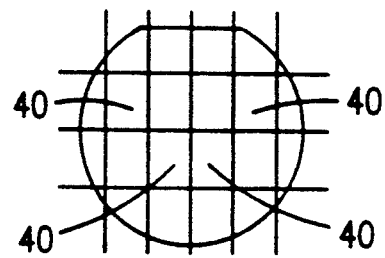
FIGS. 4a to 4e illustrate the final basic steps of the fabrication method.
Figure 4B:
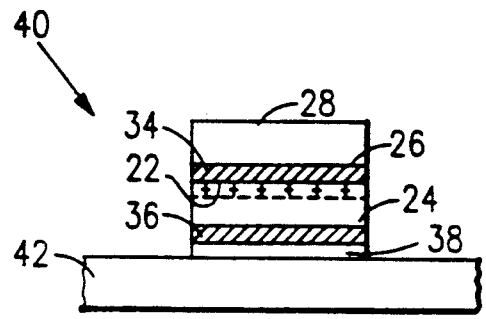
Figure 4C:
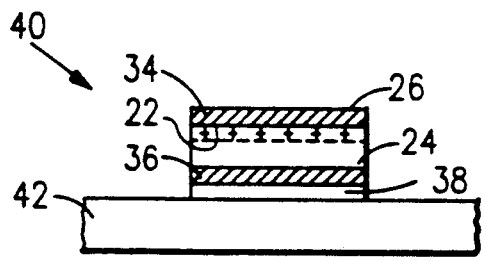
Figure 4D:
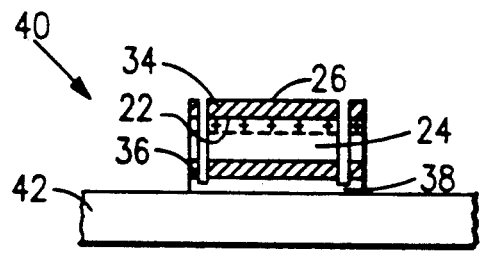
Figure 4E:
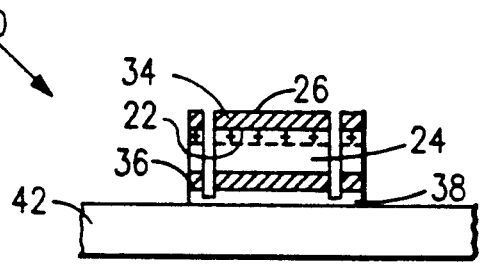

Referring to FIG. 1, there is shown a cross-sectional view of a portion of a thinned, back-illuminated, CCD 10 having a desired layer structure that is achievable by following the fabrication method of the present invention. The desired layer structure of the CCD 10 comprises a silicon dioxide passivation layer 12, a layer of silicon 14 having a p-type doped region 16, a silicon dioxide insulating layer 18, an active circuitry layer 20, and a substrate 21 having a thermal coefficient of expansion that is matched to that of the prior layers 12,14,18,20. As previously described in the prior art section, the active circuitry layer 20 is generally constructed in an array of columns and rows so as to form a gate structure, which, when a positive electrical potential is applied thereto, allows depletion regions, or potential wells, to be formed in the silicon layer 14. Also, as previously described in the summary section, the p-type region 16 of the silicon layer 14 provides a built-in electric field that drives photo-electrons toward the signal collecting potential wells formed by the CCD active circuitry 20. Furthermore, the silicon dioxide passivation layer 12 is essential to protect the silicon layer 14 from contamination problems that are detrimental to device performance, particularly with respect to quantum efficiency and spectral response.

The desired layer structure described above is realized, according to the present invention, by first ion implanting or thermally diffusing a p-type doping onto a bottom surface 22 of a top silicon wafer 24, as shown in step 1 of FIG. 2. It should be noted that the exact thickness and doping concentration of this bottom surface 22 can be chosen to optimize device performance over a specific spectral band. This is possible, for example, since an increase in thickness and doping concentration will result in an increase in electric field, thereby expanding the spectral region over which photo-electrons are capable of being detected. For purposes of this description, we will assume a doping thickness of 0.5 μm and a doping concentration equal to or greater than $10^{18}$ atoms/cm$^3$.

Referring to step 2 of FIG. 2, the positively doped bottom surface 22 of the top wafer 24 is next subjected to a thermal oxidation process along with a top surface 26 of a bottom silicon wafer 28. This thermal oxidation process results in a silicon dioxide passivation layer 30,32 being grown over each surface 22,26, respectively. After the thermal oxidation process is complete, the top wafer 24 and the bottom wafer 28 are thermally bonded together forming a single silicon dioxide passivation layer 34 between them, as shown in step 3. It should be noted that both the thermal oxidation process and the thermal bonding process are performed using standard procedures that are well known in the art of integrated circuit fabrication.

After the top 24 and bottom 28 wafers are bonded together, the top wafer 24 is thinned to a thickness of approximately 10 μm using standard techniques, as shown in step 4 of FIG. 2. This step is followed by a conventional fabrication of active CCD circuitry, wherein an insulation layer of silicon dioxide 36 is formed followed by a polysilicon gate structure 38, as shown in steps 5 and 6. At this point, devices from the above-described layered structure could be used with no further processing as conventional, front-illuminated, CCD's. For back-illuminated CCD's, however, a series of additional processing steps are required, without which there would be little justification for the present invention fabrication method.

Prior to describing the additional processing steps mentioned above, it should be noted that there are alternative methods for achieving a layered structure that is similar to the one described above. One alternative method that is particularly noteworthy is shown in FIG. 3.

Referring to step 1 of FIG. 3, a bottom surface 50 of a top silicon wafer 52 and a top surface 54 of a bottom silicon wafer 56 are both subject to a thermal oxidation process wherein a silicon dioxide passivation layer 58,60 is grown over each surface 50,54, respectively. The two wafers 52,56 are then thermally bonded together forming a single passivation layer 61 between them, as shown in step 2 of FIG. 3. This thermal bonding process results in a substrate having a silicon/silicon-dioxide/silicon sandwich structure, a substrate that is commonly used as a starting substrate for silicon-on-insulator (SOI) devices. Thus the reason that this alternate method is particularly noteworthy. Of course, this substrate is different from the one shown in step 3 of FIG. 2, since it has not yet been doped.

Referring now to step 3 of FIG. 3, the top wafer 52 is thinned to a thickness of approximately 0.5 μm using known techniques. The top wafer 52, or, more appropriately, layer, is then ion implanted or thermally diffused with a positive doping, as shown in step 4. An epitaxial layer of silicon 62 is then formed over the positively doped layer 52 to achieve a total silicon thickness of approximately 10 μm, as shown in step 5. Fabrication of active CCD circuitry then proceeds in a conventional manner with the formation of an insulation layer of silicon dioxide 64, followed by a polysilicon gate structure 66, as shown in steps 6 and 7.

As with the layered structure shown in step 6 of FIG. 2, devices from the layered structure shown in step 7 of FIG. 3 could be used with no further processing as conventional front-illuminated, CCD's. Furthermore, devices from the layered structure shown in step 7 of FIG. 3 also require a series of additional processing steps if they are to be used as back-illuminated CCD's. These required additional processing steps are identical for devices from the layered structures shown in both FIGS. 2 and 3, although they will now be described with reference to FIG. 2 only.

Referring to step 1 of FIG. 4, the layered structure shown in step 6 of FIG. 2 is diced to form individual CCD dies 40. However, it is not necessary to first dice into individual CCD dies. The process at this point could, for example, continue at the full wafer level with dicing carried out after the entire bottom silicon wafer is removed. For illustration, the process will be described assuming that dicing takes place first. The active circuitry side of each of these individual CCD dies 40 are then mounted or bonded to a substrate 42 having a thermal coefficient of expansion that is matched to that of the die 40, as shown in step 2. This bonding process is thoroughly characterized and described in the copending patent application previously incorporated herein by reference.

Once a die 40 has been bonded to a substrate 42, the bottom silicon wafer layer 28 is removed using standard techniques, as shown in step 3. This etching process is simplified by the presence of the passivation layer 34, since it acts as a stop etch layer. Thus, the presence of the passivation layer 34 makes this etching process a non-critical procedure of simply etching away the bottom silicon wafer layer 28 with no need to precisely control its final thickness or its uniformity. Furthermore, after the bottom silicon wafer layer 28 has been etched away, the presence of the passivation layer 34 protects the bottom surface 22 of the thinned top silicon wafer layer 24 from surface charging, surface state formation, and other contamination problems all of which are detrimental to device performance, particularly with respect to quantum efficiency and spectral response.

After completion of the etching process of step 3, it is required that bonding pads to the active CCD circuitry be exposed. Since the CCD die 40 is mounted to the substrate 42 at its pixel face, the bonding pads are buried under several layers of material 34,28,36, and thus must be exposed by etching through these layers 34,28,36. This final etching process, shown in step 4, is performed using conventional etching techniques, and is followed by step 5, wherein the individual devices are cut to their final size. Both steps 4 and 5 are thoroughly characterized and described in the copending patent application previously incorporated by reference. An alternative method for accessing the bond pads makes use of a metallized layer on the support substrate 42. This metallized layer is patterned to contact individual bond pads and to bring those electrical contacts out beyond the dice edges. The electrical contact between the metallized leads and the bond pads is assisted by use of indium bumps.

With the present invention fabrication method now fully described, it can thus be seen that the primary objective set forth above is efficiently attained and, since certain changes may be made to the above-described fabrication method without departing from the scope of the invention, it is intended that all matter contained in the above description or shown in the accompanying drawings shall be interpreted as illustrative and not in a limiting sense.

What is claimed is:

1. A method for fabricating thinned, back-illuminated, solid state image sensors, said method comprising the steps of:

positively doping a bottom surface of a top semiconductor wafer so as to create an electric field within said top wafer;

oxidizing said bottom surface of said top wafer and a top surface of a bottom semiconductor wafer to create a passivation oxide layer over each said surface;

bonding said bottom surface of said top wafer and said top surface of said bottom wafer together so as to create a single layer of passivation oxide between said wafers;

thinning said top wafer along a top surface;

oxidizing said top surface of said thinned top wafer to create an insulating oxide layer;

fabricating active electronic circuitry on said insulating oxide layer to form a layered structure comprising a layer of said bottom wafer, said single layer of passivation oxide, a layer of said thinned top wafer, said insulating oxide layer, and a layer of said active electronic circuitry;

dicing said layered structure to create a plurality of individual layered structure dies;

bonding said layer of active electronic circuitry of each of said plurality of layered structure dies to a substrate;

etching said bottom wafer layer from each of said plurality of bonded, layered structure dies to expose said single layer of passivation oxide;

etching through said single layer of passivation oxide, said thinned top wafer layer, and said insulating oxide layer in each of said plurality of bonded, layered structure dies to expose a plurality of bonding pads located within said layer of active electronic circuitry; and sizing each of said plurality of bonded, layered structure dies to create a plurality of thinned, back-illuminated, solid state image sensors, wherein images that are irradiated onto said single layer of passivation oxide produce photo-electrons in said thinned top wafer layer which are driven toward said layer of active electronic circuitry by said electric field and whereby said active electronic circuitry can be controlled to sense said photo-electrons, and hence said images.

2. The method as defined in claim 1, wherein said step of positively doping comprises ion implanting said bottom surface of said top wafer with a p-type dopant material.

3. The method as defined in claim 1, wherein said step of positively doping comprises thermally diffusing said bottom surface of said top wafer with a p-type dopant material.

4. The method as defined in claim 1, wherein said step of performing an oxidation process on said bottom surface of said top wafer and said top surface of said bottom wafer comprises performing a thermal oxidation process to create a silicon dioxide passivation layer over each said surface.

5. The method as defined in claim 1, wherein said step of bonding said bottom surface of said top wafer and said top surface of said bottom wafer comprises thermally bonding said wafers to create a single silicon dioxide passivation layer between them.

6. The method as defined in claim 1, wherein said step of thinning said top wafer along said top surface comprises thinning said top wafer using chemical etching techniques.

7. The method as defined in claim 1, wherein said step of performing an oxidation process on said thinned top surface of said top wafer comprises performing a thermal oxidation process to create a silicon dioxide insulating layer.

8. The method as defined in claim 1, wherein said step of fabricating active electronic circuitry comprises fabricating a conductive gate structure using conventional integrated circuit fabrication techniques.

9. The method as defined in claim 1, wherein said step of bonding said layer of active electronic circuitry of each of said plurality of layered structure dies to a substrate comprises epoxy bonding said layer of active electronic circuitry to a substrate having a thermal coefficient of expansion that is matched to that of said layered structure die.

10. The method as defined in claim 1, wherein said step of etching said bottom wafer layer comprises chemical etching said bottom wafer layer.

11. The method as defined in claim 1, wherein said step of etching through said single layer of passivation oxide, said thinned top wafer layer, and said insulating oxide layer in each of said plurality of bonded, layered structure dies comprises chemical etching said layers.

12. A method for fabricating thinned, back-illuminated, solid state image sensors, said method comprising the steps of:

performing an oxidation process on a bottom surface of a top semiconductor wafer and on a top surface of a bottom semiconductor wafer to create a passivation oxide layer over each said surface;

bonding said bottom surface of said top wafer and said top surface of said bottom wafer together to create a single layer of passivation oxide between them;

thinning said top wafer along a top surface;

positively doping said thinned top wafer;

depositing a semiconductor epitaxial layer on said top surface of said thinned top wafer such that an electric field is created within said semiconductor epitaxial layer and said thinned top wafer due to said positive doping;

performing an oxidation process on said semiconductor epitaxial layer to create an insulating oxide layer;

fabricating active electronic circuitry on said insulating oxide layer to form a layered structure comprising a layer of said bottom wafer, said single layer of passivation oxide, a layer of said thinned top wafer, said semiconductor epitaxial layer, said insulating oxide layer, and a layer of said active electronic circuitry;

dicing said layered structure to create a plurality of individual layered structure dies;

bonding said layer of active electronic circuitry of each of said plurality of layered structure dies to a substrate;

etching said bottom wafer layer from each of said plurality of bonded, layered structure dies to expose said single layer of passivation oxide;

etching through said single layer of passivation oxide, said thinned top wafer layer, said semiconductor epitaxial layer, and said insulating oxide layer in each of said plurality of bonded, layered structure dies to expose a plurality of bonding pads located within said layer of active electronic circuitry; and sizing each of said plurality of bonded, layered structure dies to create a plurality of thinned, back-illuminated, solid state image sensors, wherein images that are irradiated onto said single layer of passivation oxide produce photo-electrons in said thinned top wafer layer and said semiconductor epitaxial layer which are driven toward said layer of active electronic circuitry by said electric field, and whereby said active electronic circuitry can be controlled to sense said photo-electrons, and hence said images.

13. The method as defined in claim 12, wherein said step of performing an oxidation process on said bottom surface of said top wafer and said top surface of said bottom wafer comprises performing a thermal oxidation process to create a silicon dioxide passivation layer over each said surface.

14. The method as defined in claim 12, wherein said step of bonding said bottom surface of said top wafer and said top surface of said bottom wafer comprises thermally bonding said wafers to create a single silicon dioxide passivation layer between them.

15. The method as defined in claim 12, wherein said step of thinning said top wafer along said top surface comprises thinning said top wafer using chemical etching techniques.

16. The method as defined in claim 12, wherein said step of positively doping comprises ion implanting said thinned top wafer with a p-type dopant material.

17. The method as defined in claim 12, wherein said step of positively doping comprises thermally diffusing said thinned top wafer with a p-type dopant material.

18. The method as defined in claim 12, wherein said step of depositing a semiconductor epitaxial layer on said top surface of said thinned top wafer comprises performing an epitaxial process on said top surface to form said semiconductor epitaxial layer.

19. The method as defined in claim 12, wherein said step of performing an oxidation process on said semiconductor epitaxial layer comprises performing a thermal oxidation process to create a silicon dioxide insulating layer.

20. The method as defined in claim 12, wherein said step of fabricating active electronic circuitry comprises fabricating a conductive gate structure using conventional integrated circuit fabrication techniques.

21. The method as defined in claim 12, wherein said step of bonding said layer of active electronic circuitry of each of said plurality of layered structure dies to a substrate comprises epoxy bonding said layer of active electronic circuitry to a substrate having a thermal coefficient of expansion that is matched to that of said layered structure die.

22. The method as defined in claim 12, wherein said step of etching said bottom wafer layer comprises chemical etching said bottom wafer layer.

23. The method as defined in claim 12, wherein said step of etching through said single layer of passivation oxide, said thinned top wafer layer, said semiconductor epitaxial layer, and said insulating oxide layer in each of said plurality of bonded, layered structure dies comprises chemical etching said layers.

* * * * *